(12) United States Patent
Kolody et al.

(10) Patent No.: US 6,759,598 B2
(45) Date of Patent: Jul. 6, 2004

(54) POWER DISTRIBUTION BACKPLANE

(75) Inventors: Timothy Kolody, Lorain, OH (US);
Richard E. Trifiletti, Lorain, OH (US);
Scott C. Lewis, Amherst, OH (US);
Kurt P. Fattman, Westlake, OH (US)

(73) Assignee: Marconi Communications, Inc., Cleveland, OH (US)

( * ) Notice: Subject to any disclaimer, the term of this patent is extended or adjusted under 35 U.S.C. 154(b) by 59 days.

(21) Appl. No.: 09/861,148

(22) Filed: May 18, 2001

(65) Prior Publication Data

US 2002/0170741 A1 Nov. 21, 2002

(51) Int. Cl.⁷ ............................ H01R 12/04; H05K 1/11
(52) U.S. Cl. ........................ 174/261; 174/250; 361/388
(58) Field of Search ................................ 174/260, 261; 361/788, 328, 794

(56) References Cited

U.S. PATENT DOCUMENTS

| | | | | |
|---|---|---|---|---|
| 4,046,445 A | * | 9/1977 | Anhalt | 439/109 |
| 5,036,160 A | * | 7/1991 | Jackson | 174/262 |
| 5,124,567 A | | 6/1992 | Fujita et al. | |
| 5,270,903 A | * | 12/1993 | McMichen et al. | 174/261 |
| 5,532,907 A | | 7/1996 | Asselta et al. | |
| 5,617,299 A | | 4/1997 | Knoop et al. | |
| 5,875,091 A | * | 2/1999 | Rieken | 375/287 |
| 6,205,029 B1 | | 3/2001 | Byrne et al. | |
| 6,431,914 B1 | * | 8/2002 | Billman | 439/608 |

* cited by examiner

*Primary Examiner*—Kamand Cuneo
*Assistant Examiner*—Jeremy Norris
(74) *Attorney, Agent, or Firm*—Jones Day (57) ABSTRACT

A power distribution backplane includes a pair of metal panels bonded to opposite sides of a dielectric spacer. One panel is for power and the other for ground, and each is painted a different color. Connectors are provided on each panel in connector areas, with some connectors being accessible from both sides of each panel, and busbars extend out from one end of each panel.

28 Claims, 12 Drawing Sheets

POWER DISTRIBUTION BACKPLANE

BACKGROUND OF THE INVENTION

This application relates to the art of telecommunications power distribution and, more particularly, to a direct current power distribution backplane. Although the invention is particularly applicable for use in telecommunications and will be described with specific reference thereto, it will be appreciated that the invention has broader aspects and can be used for other power distribution requirements.

SUMMARY OF THE INVENTION

In accordance with the present application, a telecommunications direct current power distribution backplane acts as both the connection point for all battery and ground sources, and also as the interconnection point between two or more power and/or distribution bays.

A power distribution backplane in accordance with the present application includes a pair of copper panels laminated to opposite sides of an insulating panel. The two copper panels are painted two different colors to distinguish between positive and negative polarities. The copper panels are provided with connectors such as threaded nuts or studs for attaching busbars to distribute the two polarities to required devices.

Connector areas adjacent the periphery of the two copper panels are provided for attaching interconnect busbars or splice plates for carrying current between two or more bays. Busbars extend outwardly from the bottom ends of the two copper panels for delivering power to the backplane from power conversion units and then to other required devices.

It is a principal object of the invention to provide an improved telecommunications direct current power distribution backplane.

It is also an object of the invention to provide such a backplane having a plurality of connectors.

It is a further object of the invention to provide such a backplane having connectors that are accessible from both sides of each panel past the intermediate insulating panel.

DESCRIPTION OF A PREFERRED EMBODIMENT

Figure 1:
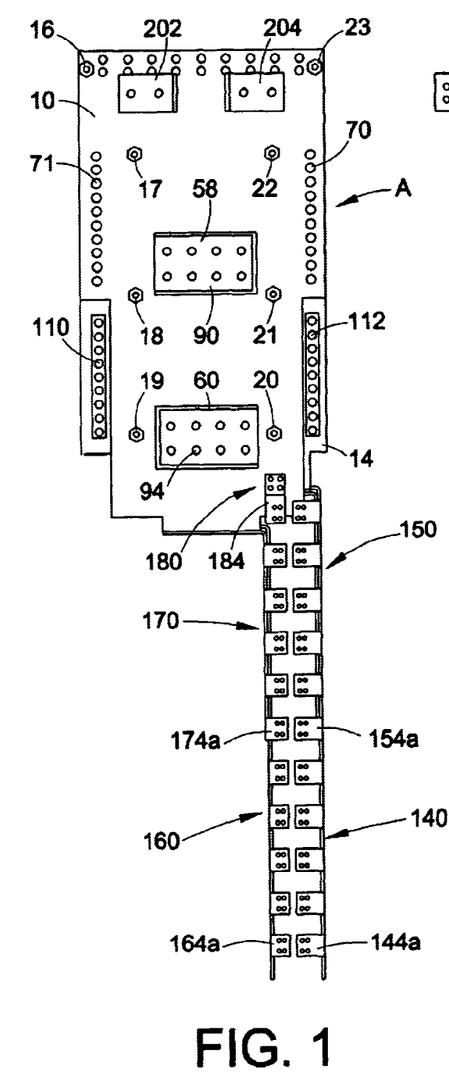
FIG. 1 is a front elevational view of a backplane in accordance with the present application.
Figure 2:
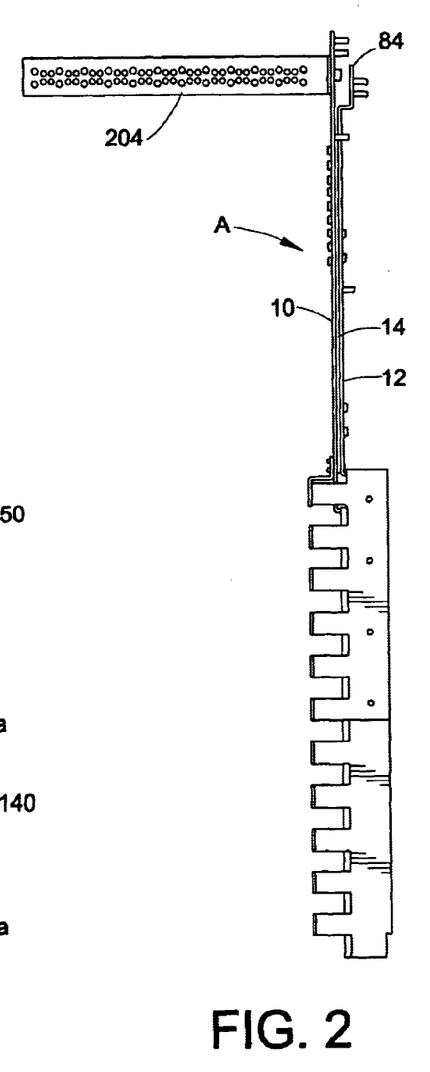
FIG. 2 is a side elevational view thereof.
Figure 3:
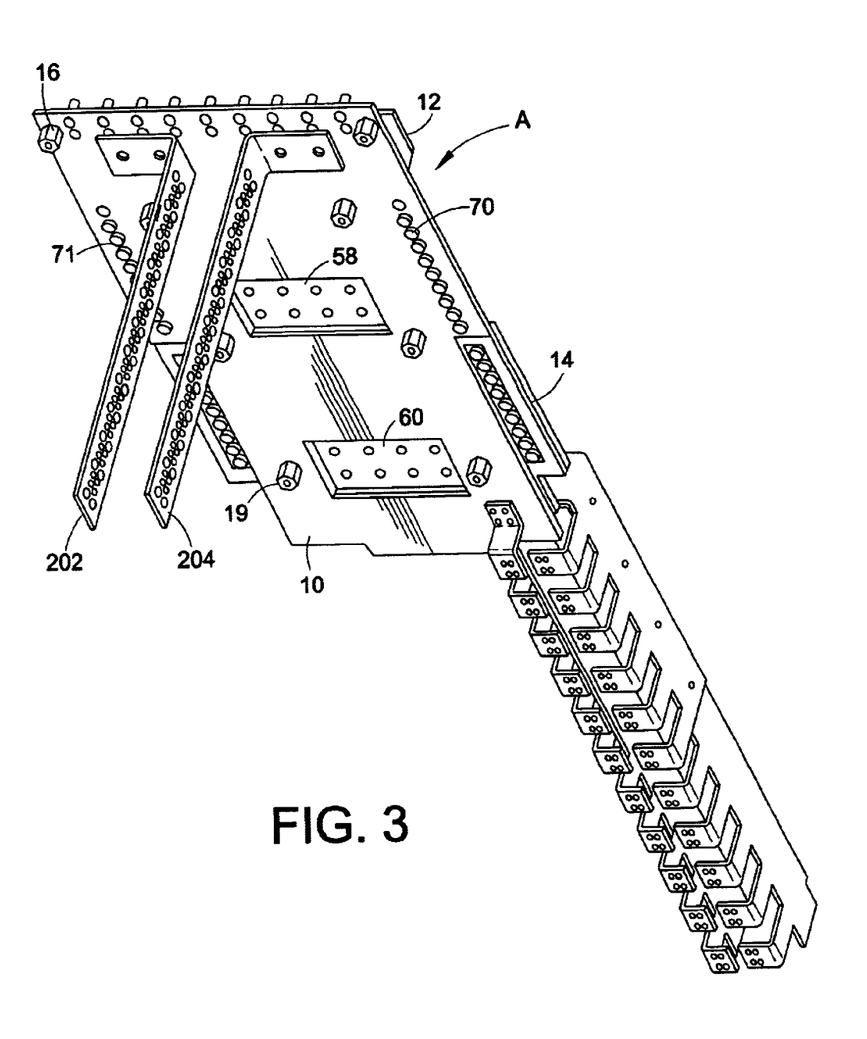
FIG. 3 is a perspective illustration thereof.

Referring now to the drawing, where the showings are purposes of illustrating a preferred embodiment of the invention only and not for purposes of limiting same, FIGS. 1–3 show an improved power distribution backplane in accordance with the present application. Laminated backplane A includes front and rear copper panels 10, 12 that are bonded to opposite faces of an intermediate dielectric spacer panel 14. Obviously, metals other than copper or plated metals may be used for the metal panels where conditions are appropriate.

The metal panels have a significant thickness such as around one-fourth inch each so that they are structural panels as distinguished from foil or deposited metal film. Electrical insulating spacer panel 14 may be of any suitable plastic material including FR-4, and also has a thickness of around one-fourth inch. Front panel 10 has a plurality of mounting nuts 16–23 swaged thereto on the outer surface thereof for attaching backplane A to a framework.

Figure 6:
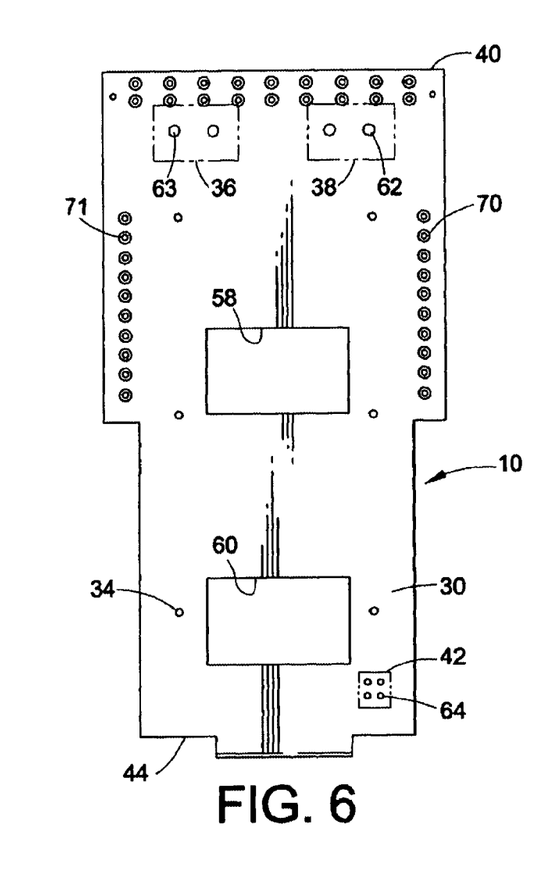
FIG. 6 is a front elevational view of a front panel.
Figure 7:
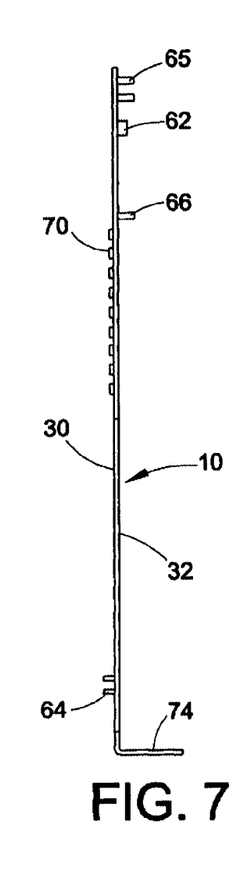
FIG. 7 is a side elevational view thereof.
Figure 8:
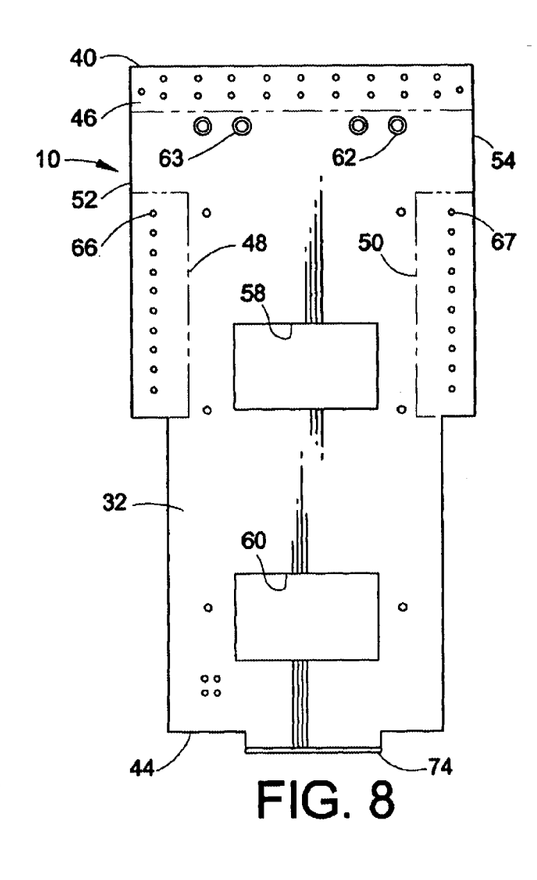
FIG. 8 is a rear elevational view thereof.

FIGS. 6–8 show generally rectangular front panel 10 as having an outer surface 30 and an inner surface 32 that faces toward the insulating panel 14 and is bonded thereto by adhesive. Front panel 10 has a plurality of mounting holes therethrough, only one of which is generally indicated at 34, in the same locations as mounting nuts 16–23 of FIG. 1. The mounting holes are provided for receiving projections on the mounting nuts for swaging same to the panel.

Opposite surfaces 30, 32 of front panel 10 are coated with an electrical insulating paint such as a powder coating. Although different colors may be used, the coating applied to surfaces 30, 32 of panel 10 may be red to designate a negative polarity or ground. A pair of spaced-apart rectangular areas 36, 38 adjacent top end 40 of front plate 10 are masked prior to coating the outer surface so that the areas are exposed to bare metal. Another small rectangular area 42 of outer surface 30 adjacent bottom end 44 of front panel 10 also is masked prior to coating outer surface 30 so that area 42 is exposed to the bare metal of front panel 10.

Inner surface 32 of panel 10 has an uncoated area 46 exposed to bare metal adjacent top end 40 thereof and across the entire width thereof. Additional uncoated rectangular areas 48, 50 are provided adjacent opposite sides 52, 54. Uncoated rectangular areas 48, 50 are located intermediate top and bottom ends 40, 44 but are closer to top end 40 than to bottom end 44.

A pair of vertically-spaced rectangular openings 58, 60 are provided through front panel 10. These openings are aligned with corresponding openings in the insulating spacer to expose the inner surface of the back panel from the front panel side of the lamination.

A plurality of holes are provided through panel 10 in each uncoated area for use in swaging connectors to the panel. Within each uncoated area 36, 38, panel 10 has a pair of spaced-apart holes in which internally threaded nuts are swaged to project outwardly from panel inner surface 32. Only one nut in each pair is identified by a number 62, 63.

The plurality of holes through panel 10 within uncoated area 42 have externally threaded studs swaged therein to project outwardly perpendicular from panel outer surface 30, and only one of such studs is indicated by a number 64.

The holes through panel 10 within uncoated area 46 adjacent panel top end 40 also have externally threaded studs swaged therein to project outwardly perpendicular from panel inner surface 32, and only one of such studs is generally indicated by a number 65.

In the arrangement illustrated in the drawing, there are four studs within uncoated area 42 and 18 studs within uncoated area 46 in two aligned rows of nine each. Each top hole through panel 10 within uncoated splice plate areas 48, 50 has an externally threaded stud 66, 67 swaged thereto to project outwardly perpendicular from panel inner surface 32. The remainder of the holes within each uncoated area 48, 50 have internally threaded nuts swaged therein to project outwardly from panel outer surface 30. These areas are used to interconnect adjacent backplanes with busbars in the form of flat copper splice plates as described later herein.

In the arrangement illustrated in the drawing, each uncoated area 48, 50 has 10 vertically-spaced holes therethrough for swaging nine nuts and one stud to the panel. All of the nuts project outwardly from panel outer surface 30 and only one such nut in each uncoated area is designated by a number 70, 71.

A centrally located busbar mounting flange 74 extends outwardly from bottom panel end 44 of front panel 10 perpendicular to inside surface 32. The flange has a plurality of spaced-apart fastener receiving holes therethrough for receiving fasteners to attach a busbar to the backplane.

Figure 9:
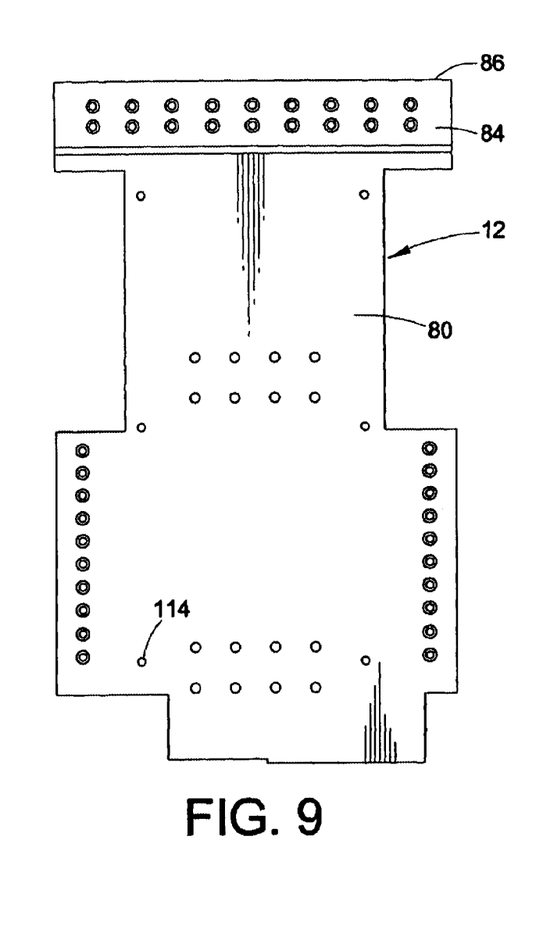
FIG. 9 is an elevational view of a rear panel.
Figure 10:
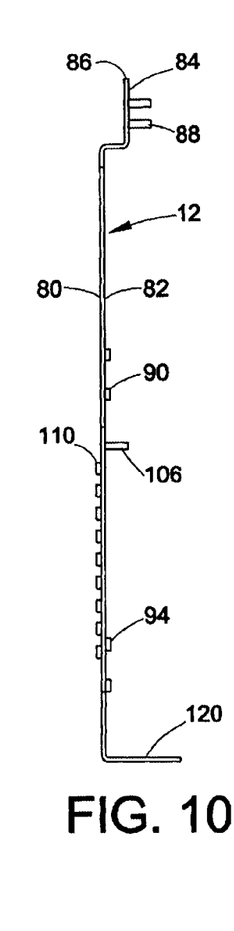
FIG. 10 is a side elevational view thereof.
Figure 11:
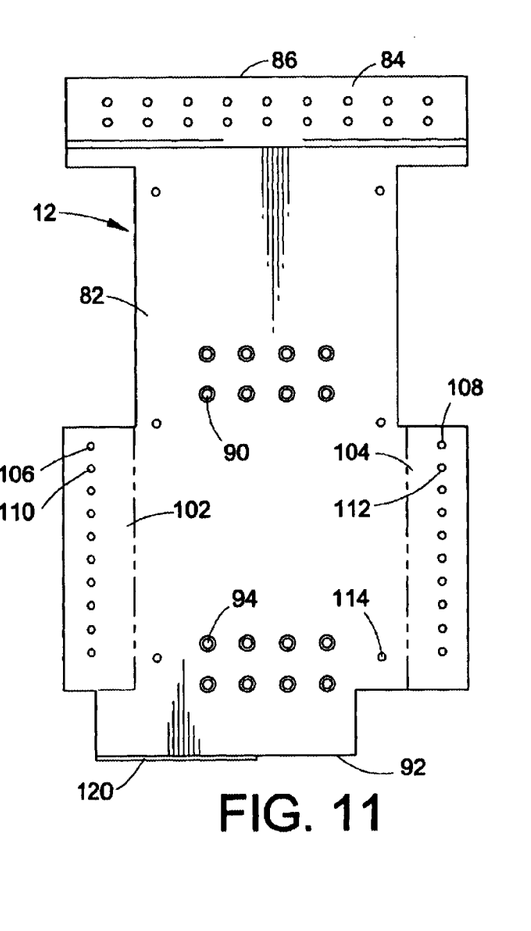
FIG. 11 is an elevational view of the opposite side thereof.

FIGS. 9–11 show rear panel 12 having an inner surface 80 that is bonded to the insulating panel and an outer surface 82. Rear panel 12 has an upper offset portion 84 adjacent top end 86 thereof. Offset portion 84 is offset in a direction away from front panel 10 as shown in FIG. 2 to provide a channel for receiving cables and wires. Offset portion 84 is provided with 18 holes in two aligned rows of nine each to receive studs that are swaged to the rear plate. The studs project outwardly perpendicular from rear surface 82 as shown in FIG. 10 and only one such stud is generally indicated by a number 88.

The central portion of rear panel 12 has 8 holes therethrough in two aligned rows of four each to receive internally threaded nuts that are swaged therein and extend outwardly from outer surface 82. Only one such nut is generally indicated by number 90.

Eight holes in two aligned rows of 4 each are provided through rear plate 12 adjacent bottom end 92 thereof. Internally threaded nuts are swaged within the holes and project outwardly from outer surface 82. Only one such nut is indicated by a number 94.

Both surfaces of rear panel 12 are coated with a blue powder coating to designate a positive polarity or a power panel.

Opposite side extensions on rear plate 12 adjacent bottom end 92 thereof are masked on outer surface 82 to provide a pair of generally rectangular splice plate areas 102, 104 in which the bare metal of the panel is exposed. These areas are used to interconnect adjacent backplanes with busbars in the form of flat copper plates as described later herein. Each area 102, 104 has 10 vertically-spaced holes therethrough with the uppermost hole receiving an externally threaded stud that is swaged therein and extends outwardly perpendicular from outer surface 82. These studs are indicated by numbers 106, 108. The other nine holes in each area receive internally threaded nuts that are swaged to the plate and project outwardly from inner surface 80 thereof. Only one nut in each area 102, 104 is designated by a number 110, 112. Rear panel 12 has mounting holes therethrough corresponding to the locations of mounting nuts 17–19 and 20–22 in FIG. 1. Only one of such mounting holes in rear plate 12 is designated by a number 114 in FIG. 9.

A busbar mounting flange 120 extends outwardly from bottom end 92 perpendicular to the panel and to outer surface 82 thereof. Busbar mounting flange 120 has a plurality of spaced-apart fastener receiving holes therethrough for receiving fasteners to attach a busbar thereto.

Figure 12:
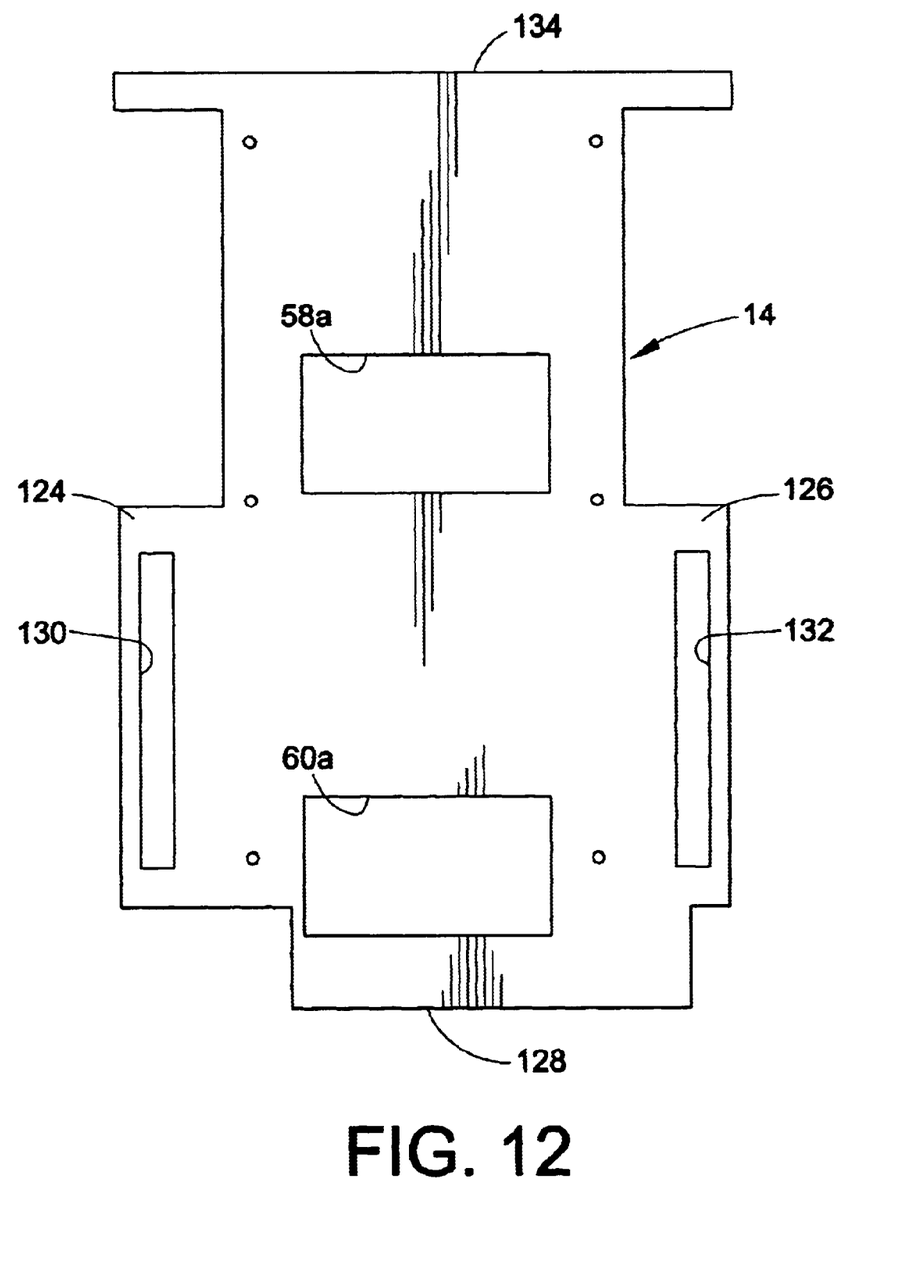
FIG. 12 is an elevational view of an insulating panel that is positioned between the panels of FIGS. 6–11.

With reference to FIG. 12, insulating spacer panel 14 has a pair of rectangular openings 58a, 60a of the same size and spacing as rectangular openings 58, 60 in front panel 10.

Opposite side extensions 124, 126 adjacent bottom end 128 of spacer panel 14 have vertically elongated rectangular openings 130, 132 therethrough. Extensions 124, 126 overlie the areas of inside surface 80 on rear plate 12 around nuts 110, 112 of FIG. 11 while accommodating the plurality of vertically spaced nuts 110, 112 within rectangular openings 130, 132.

Top end 134 of insulating spacer panel 14 is located at the beginning of the offset 84 in rear panel 12 as indicated in FIG. 2. The panels and the insulating spacer panel are laminated together as illustrated in FIGS. 1–5 by the use of adhesive applied to the facing surfaces.

Figures 13, 14:
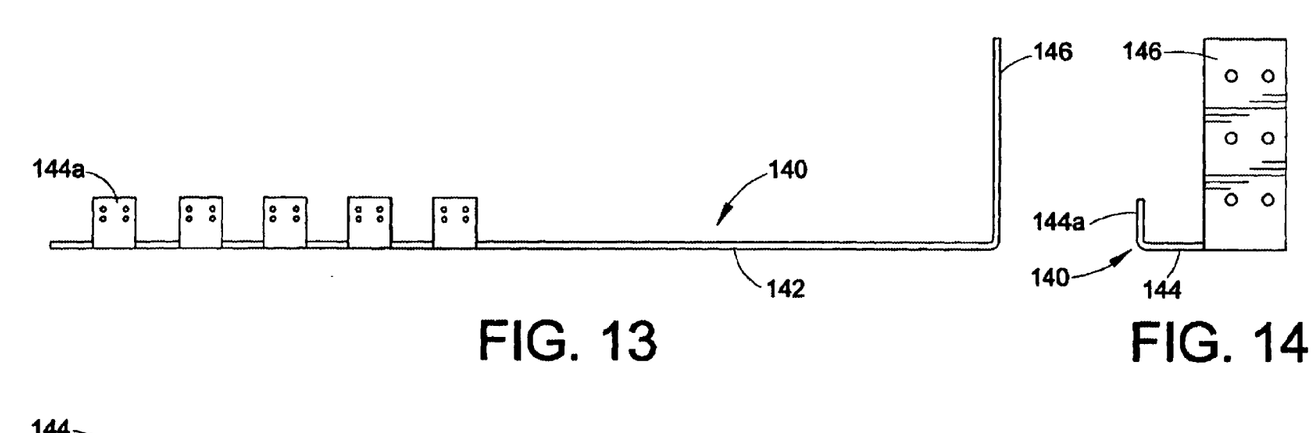
FIG. 13 is a side elevational view of a busbar.
FIG. 14 is an end elevational view thereof.
Figure 15:
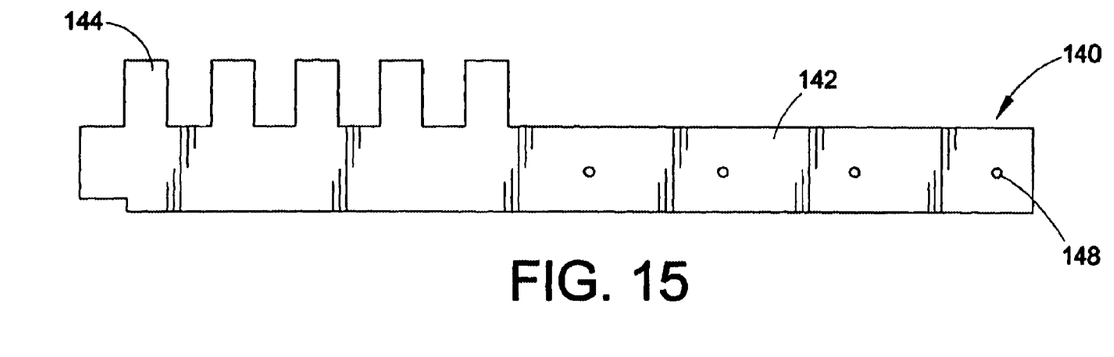
FIG. 15 is a bottom plan view thereof.

FIGS. 13–15 show a busbar 140 having an elongated flat base portion 142 with a plurality of spaced-apart parallel fingers projecting therefrom in a common plane with the base portion. Only one of the five fingers is identified by a number 144 in FIGS. 13–15. Each finger terminates in a tab extending perpendicular thereto and only one tab is identified by a number 144a in FIGS. 13 and 14. Each finger has a plurality of fastener receiving holes therethrough for attaching cables and the like thereto.

A mounting flange 146 extends perpendicular to base portion 142 and has a plurality of spaced-apart fastener receiving holes therethrough for receiving fasteners to attach mounting flange 146 to flange 120 on rear panel 12. A plurality of longitudinally spaced-apart holes are provided in base portion 142 adjacent the flange end thereof for attaching another busbar thereto and only one of such holes is identified by number 148.

Figure 16:
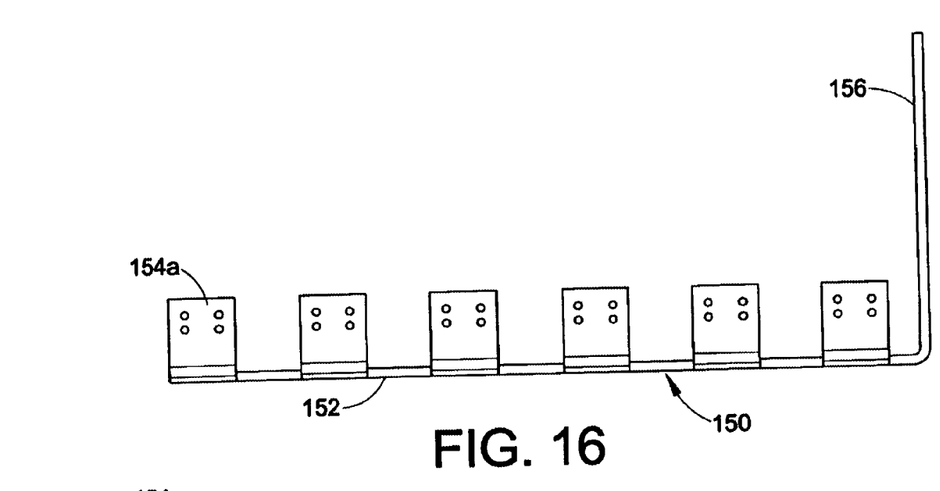
FIG. 16 is a side elevational view of another busbar.
Figure 17:
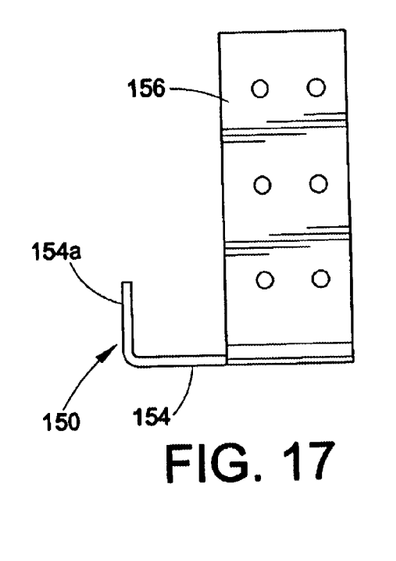
FIG. 17 is an end elevational view thereof.
Figure 18:
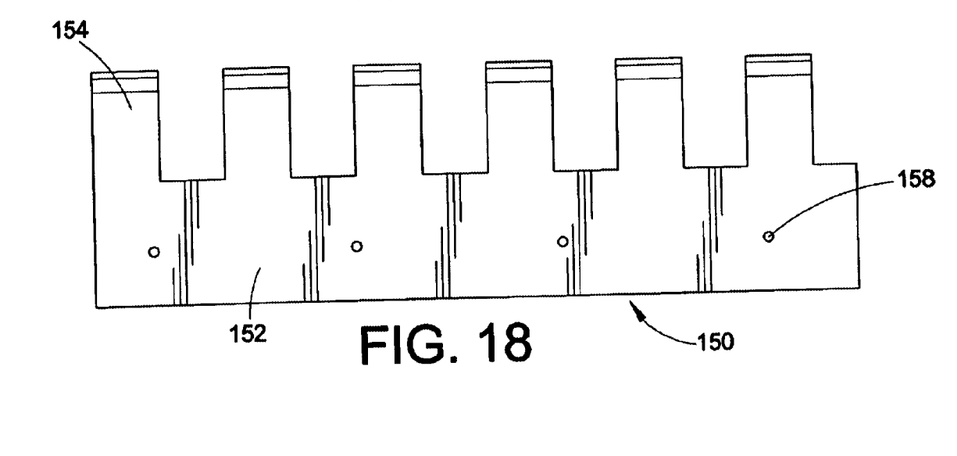
FIG. 18 is a bottom plan view thereof.

FIGS. 16–18 show a busbar 150 having a flat base portion 152 with a plurality of spaced-apart fingers extending therefrom in a common plane therewith. Only one of the six fingers illustrated is identified by number 154. A tab on the end of each finger extends perpendicular thereto and only one such tab is identified by a number 154a. Each tab has a plurality of fastener receiving holes therethrough for use in attaching cables or the like thereto. A mounting flange 156 extends perpendicular to base portion 152 at one end thereof. A plurality of mounting holes through mounting flange 156 receiving fasteners for attaching mounting flange 156 to mounting flange 120 on rear panel 12. A plurality of longitudinally spaced-apart fastener receiving holes in base portion 152 are alignable with fastener receiving holes 148 in base portion 142 of busbar 140 for securing the base portions of the two busbars together. Only one of the fastener receiving holes in base portion 152 of busbar 150 is identified by number 158.

Figure 19:
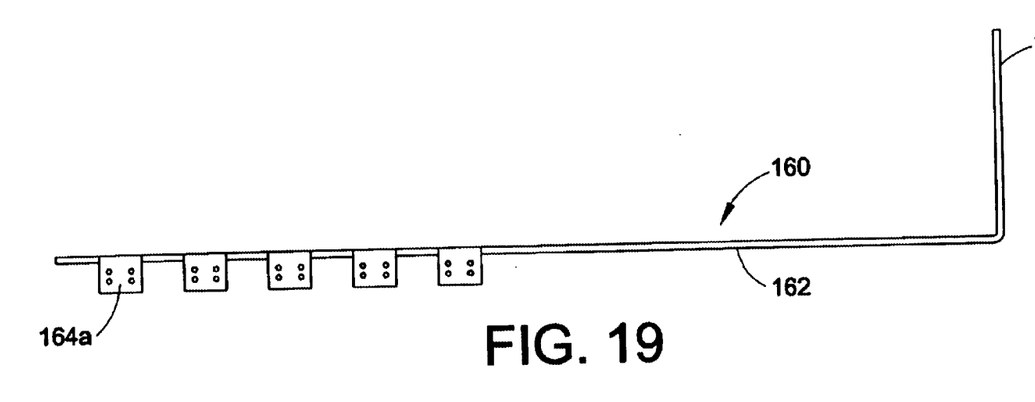
FIG. 19 is a side elevational view of another busbar.
Figure 20:
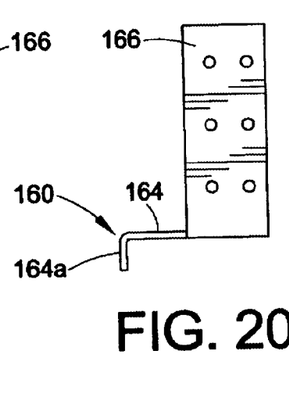
FIG. 20 is an end elevational view thereof.
Figure 21:
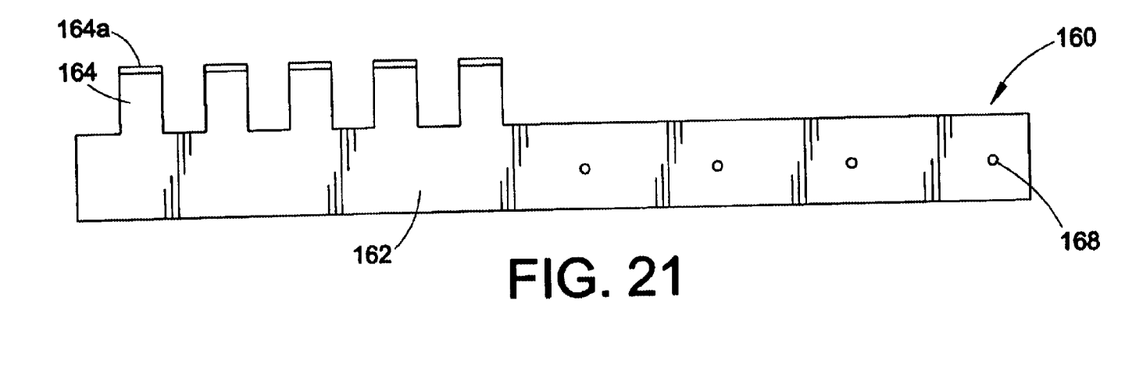
FIG. 21 is a bottom plan view thereof.

FIGS. 19–21 show a busbar 160 having a flat base portion 162 with a plurality of spaced-apart fingers extending therefrom in a common plane therewith. Only one of the five fingers illustrated is identified by number 164. A tab 164a is provided on the end of each finger extending perpendicular thereto. A plurality of fastener receiving holes through each tab receive fasteners for attaching cables or the like to the busbar. A mounting flange extends perpendicular to base portion 162 at one end thereof. Mounting flange 166 has a plurality of fastener receiving holes therethrough for attaching the busbar to mounting flange 74 on front panel 10. Flat base portion 162 has a plurality of spaced-apart holes therethrough along the length thereof adjacent the flange end thereof for receiving fasteners to attach the busbar of FIGS. 22–24 thereto.

Figure 22:
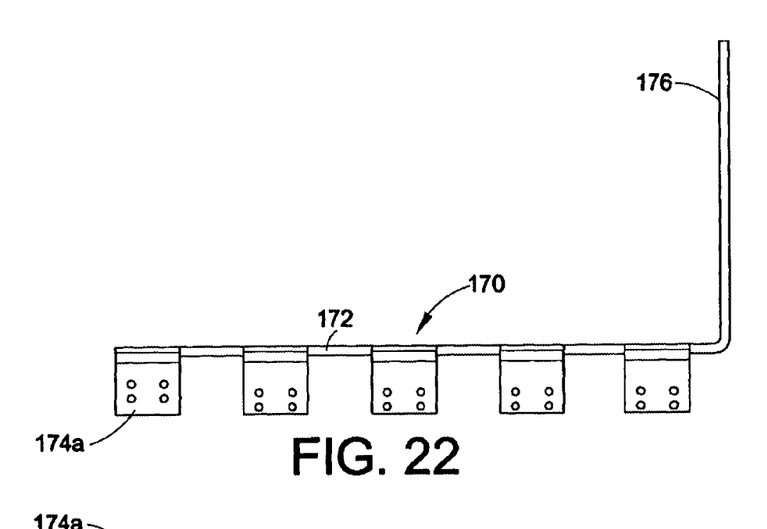
FIG. 22 is a side elevational view of another busbar.
Figure 23:
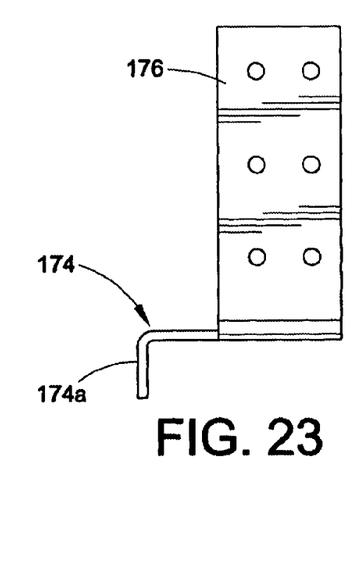
FIG. 23 is an end elevational view thereof.
Figure 24:
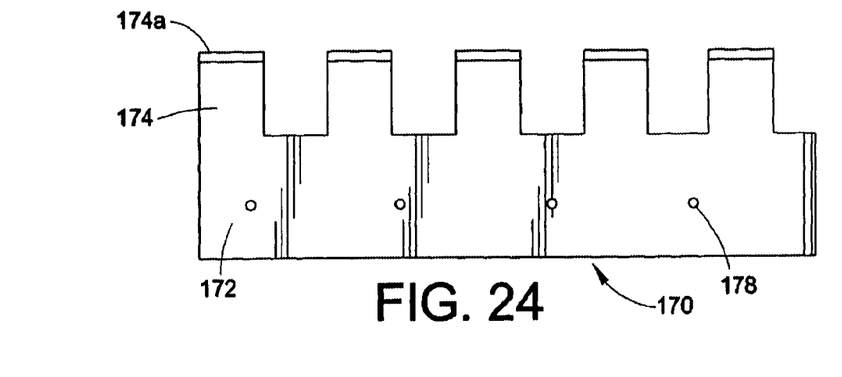
FIG. 24 is a bottom plan view thereof.

FIGS. 22–24 show a busbar 170 having a flat base portion 172 with a plurality of spaced-apart fingers extending therefrom in a common plane therewith. Only one of the five fingers illustrated is identified by a number 174. A tab extends from the end of each finger perpendicular thereto and only one such tab is identified by a number 174a. Each tab has a plurality of fastener receiving holes therethrough for receiving fasteners to attach cables or the like thereto. A mounting flange 176 extends perpendicular to base portion 174 at one end thereof. A plurality of fastener receiving holes are provided in mounting flange 176 for receiving fasteners to attach same to mounting flange 174 on front panel 10. A plurality of longitudinally spaced-apart fastener receiving holes are provided in flat base portion 172 for alignment with holes 168 in base portion 162 of busbar 160 for securing the two busbars together. Only one of the fastener receiving holes in base portion 172 is identified by a number 178.

Figure 5:
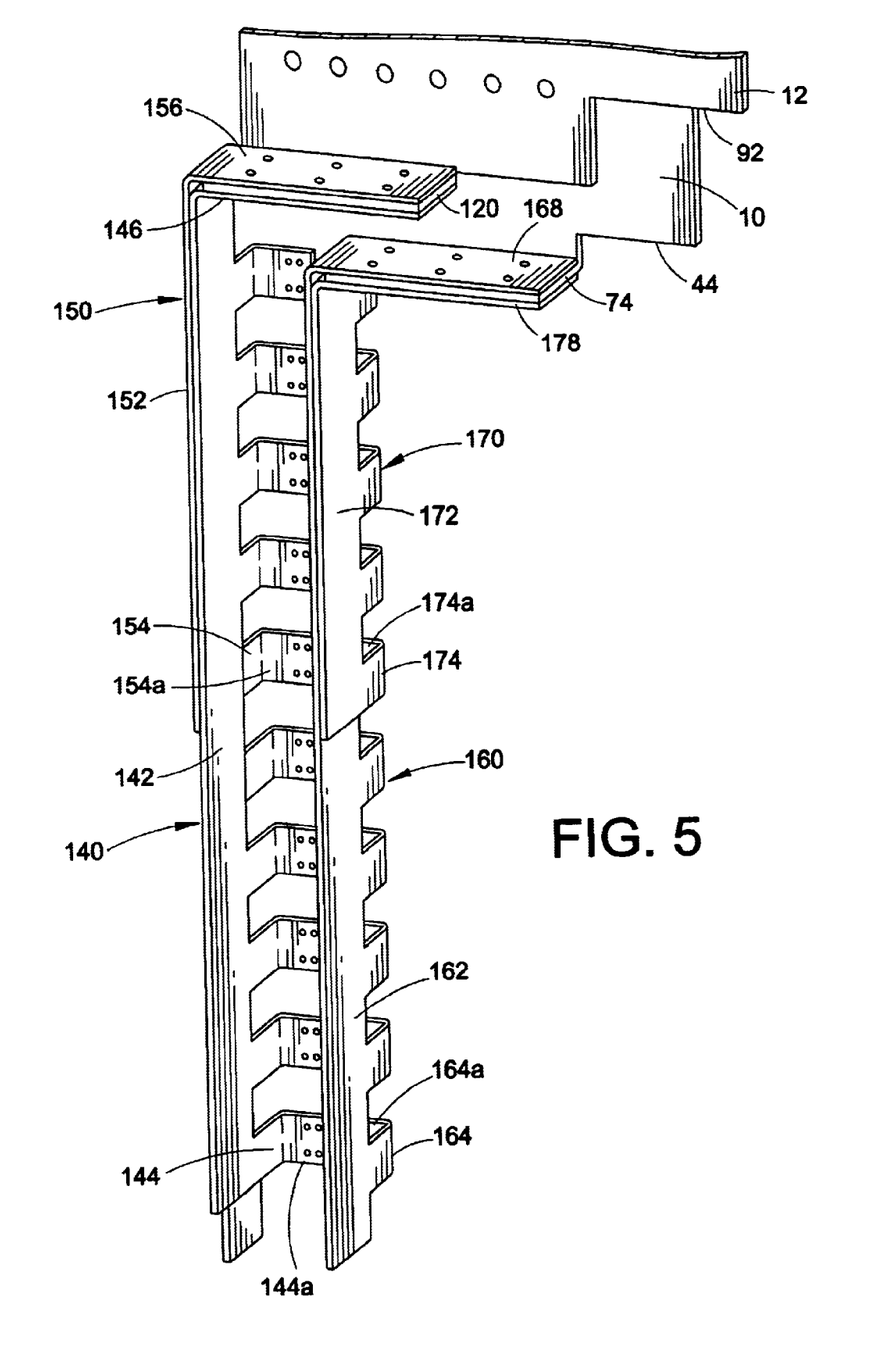
FIG. 5 is a perspective illustration showing busbars attached to the backplane of FIG. 4.

As best shown in FIG. 5, each panel mounting flange 74, 120 on front and rear panels 10, 12 is sandwiched between busbar mounting flanges 168, 178 and 146, 156. The flat base portions 142, 152 and 162 and 172 of the busbars 140, 150 and 160, 170 also are secured together with fasteners extending through aligned holes 148, 150 and 168 and 178.

Figure 25:
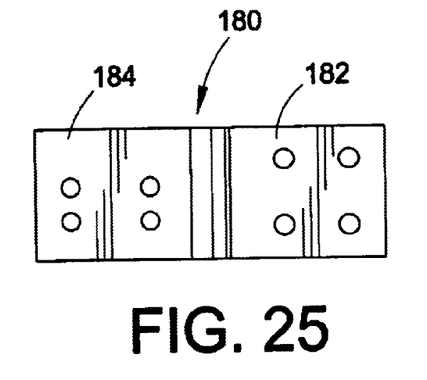
FIG. 25 is a top plan view of a connector.
Figure 26:
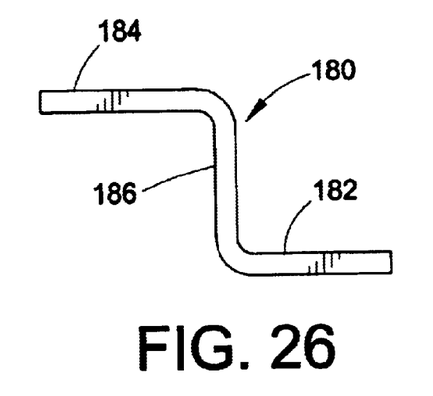
FIG. 26 is a side elevational view thereof.

FIGS. 25 and 26 show a connector 180 having a mounting flange 182 with a plurality of fastener receiving holes therethrough. A tab 184 having a plurality of fastener receiving holes therethrough extends from a base portion 186 perpendicular thereto and in the opposite direction from mounting flange 182. Mounting flange 182 is attached to front panel 10 within unmasked area 42 of FIG. 6. Connector 180 provides a supplemental connector tab for front panel 10 to supplement the tabs on busbars 160, 170 so that there are 11 connector tabs on the busbars for each front and rear panel. Busbars 140, 150 and 160, 170 are spliced together to achieve a total rating of at least 2000 amps, 200 for each finger/tab.

A pair of ground straps 202, 204 are attached to negative front ground panel 10 by the use of fasteners and the connectors 62, 63 within uncoated connector areas 36, 38 on outer surface 30 of front panel 10. A plurality of fastener receiving holes are provided in the ground straps for attaching cables thereto.

Figure 4:
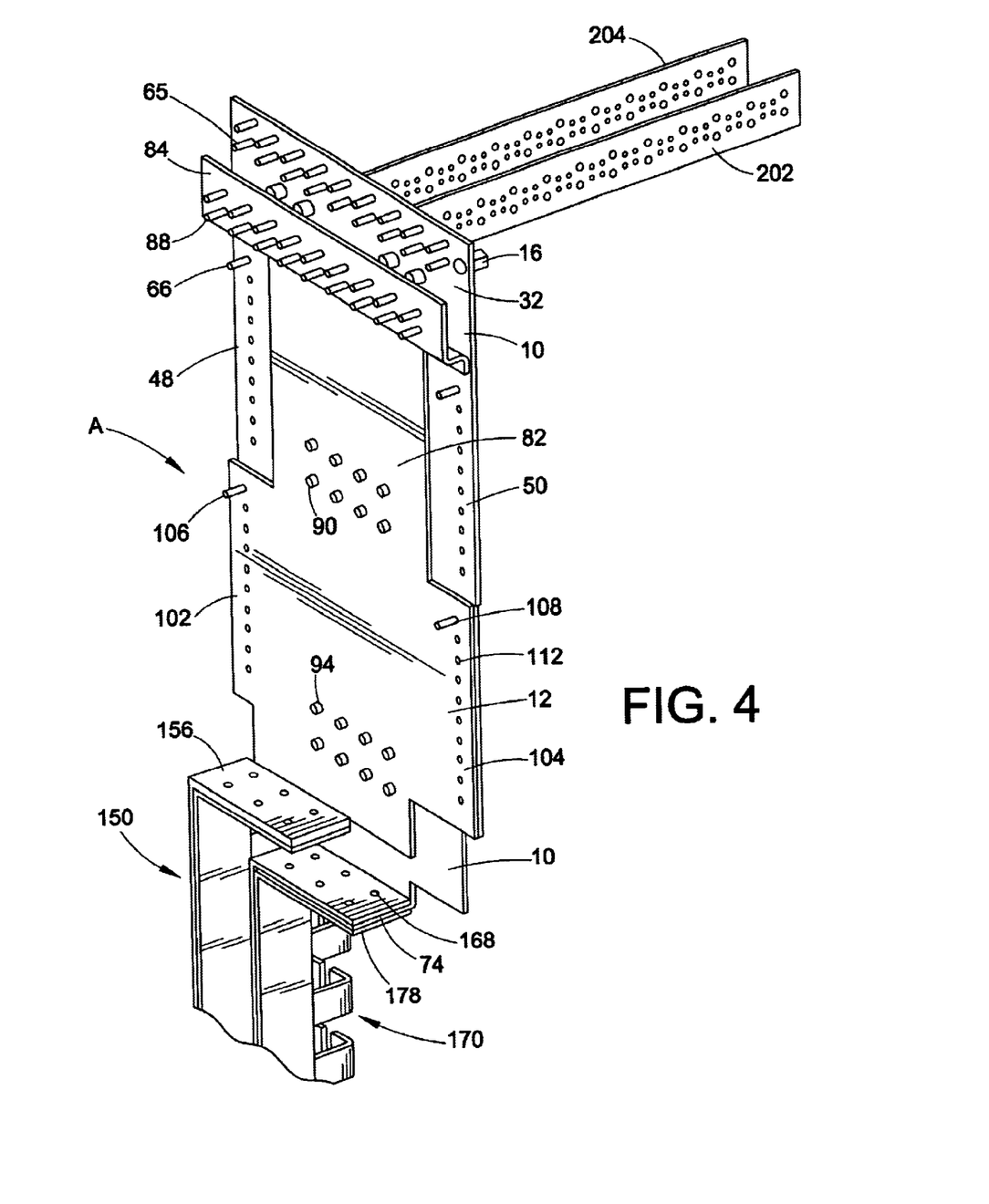
FIG. 4 is a perspective illustration from the rear side thereof.

The uncoated areas on front and rear panels 10, 12 define connector areas that have a plurality of connectors therein. Some of the connector areas on one panel are accessible past the other panel and the insulating spacer panel. For example, the entire groups of connectors 90, 94 on rear panel 12 are accessible past front panel 10 and spacer 14 through openings 58, 60 and 58a, 60a in the front panel and spacer. Connector areas 48, 50 on the inside surface 32 of front panel 10 are exposed on the rear side of backplane A as best shown in FIG. 4 so that the connectors and bare metal areas thereof thereon are accessible past the spacer panel 14 and the rear panel 12. Likewise, connectors 110, 112 in connector areas 102, 104 on outer surface 82 of rear panel 12 are exposed and accessible from the rear side of the backplane.

Figure 27:
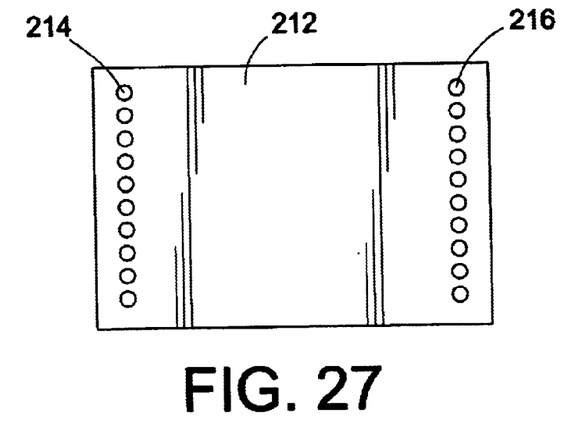
FIG. 27 is a front elevational view of a splice plate used to interconnect two or more backplanes to one another.

FIG. 27 shows an interconnect busbar in the form of a rectangular copper splice plate 212 having two vertical rows of spaced-apart holes therein, only one hole in each row of ten being designated by numbers 214, 216. These holes have the same spacing as the holes for vertical rows of connectors 70, 71 in base metal connector areas 48, 50 on inside surface 32 of front plate 10, and as the holes for vertical rows of connectors 106, 108, 110, 112 in base metal connector areas 102, 104 on outer surface 82 of rear plate 12.

Splice plates may have one end portion bolted to a splice plate area 48 on a negative plate of one backplane and have its opposite end portion bolted to a splice plate area 50 on a negative plate of an adjacent backplane. Likewise a splice plate may be bolted to splice plate to areas 102, 104 on the positive panels of adjacent backplanes. This makes it possible to transfer power from one backplane to another in adjacent bays without the need for complicated bus cables or the like. Large numbers of adjacent backplanes may be interconnected in this manner. One uppermost fastener receiving hole in a splice plate 212 may be positioned over a stud 66, 67, 106, 108 to support the splice plate while manipulating same to align the holes for inserting bolts through the splice plate holes into the nuts on the front or rear metal panels.

In the completed backplane, splice plate connectors areas 48, 50 on front panel 10 are adjacent to the top end of the backplane, while splice plate connector areas 102, 104 on rear panel 12 are adjacent the bottom end of the backplane. The splice plate connector areas are in sequence along each side of the backplane so that splice plates that connect adjacent negative front panels on adjacent backplanes do not overlap splice plates that connect adjacent positive rear panels on the same adjacent backplanes.

All of the bare metal splice plate areas face in the same direction which is toward the rear of the backplane. Areas 48, 50 are on the inside surface of front panel 10 and areas 102, 104 are on the outside surface of rear panel 12 so that all face toward the rear of the backplane when outer surface 30 of front panel 10 is considered the front of the backplane.

Although the invention has been shown and described with reference to a preferred embodiment, it is obvious that equivalent alterations and modifications will occur to others skilled in the art upon the reading and understanding of this specification. The present invention includes all such equivalent alterations and modifications and is limited only by the scope of the claims.

We claim:

1. A power distribution backplane comprising:
    a pair of metal panels bonded to opposite sides of a dielectric spacer;
    each said panel having an inside surface facing toward said dielectric spacer and an opposite outer surface;
    each of said outer surfaces having a plurality of outer surface connections thereon;
    each of said inner surfaces having inner surface connector areas that are uncovered by said dielectric spacer; and
    said inner surface connector areas having a plurality of connectors thereon.

2. The backplane of claim 1 wherein said dielectric spacer has at least one spacer opening therethrough aligned with a panel opening through one of said panels to expose an area of said inner surface on the other of said panels to define a said inner surface connector area.

3. The backplane of claim 1 therein said dielectric spacer has a plurality of spaced-apart spacer openings therein through which a plurality of said inner surface connector areas are exposed.

4. The backplane of claim 1 wherein each of said panel outer surfaces has a different color coating thereon, one of said colors designating a positive polarity and the other of said colors designating a negative polarity.

5. The backplane of claim 1 wherein said outer surface connectors include a plurality of nuts and a plurality of studs.

6. A power distribution backplane comprising: a pair of metal panels bonded to opposite sides of a dielectric spacer; each of said panels having an inside surface facing toward said dielectric spacer and an opposite outer surface; each said panel having a panel outer periphery; said spacer having a spacer outer periphery; at least one of said panels having outer peripheral portions extending outwardly beyond said panel outer periphery of the other of said panels; and a plurality of connectors on said inside surface of said outer peripheral portions.

7. The backplane of claim 6 including at least one opening through the other of said panels and said spacer to expose an inside surface portion of said one panel; and
a plurality of connectors on said inside surface portion accessible through said opening.

8. The backplane of claim 6 wherein each said panel has a busbar connecting flange thereon, each said flange extending in the same direction so that said flange on one of said panels extends past said spacer and the other of said panels.

9. A power distribution backplane comprising: a pair of metal panels bonded to opposite sides of a dielectric spacer; each said panel having an inside surface facing toward said spacer and an opposite outer surface; each of said outer surfaces having a plurality of outer surface connectors thereon; each of said inside surfaces on each of said panels having inside surface connector areas that are exposed past said spacer and the other of said panels; and a plurality of connectors on said inside surfaces of said inside surface connector areas.

10. The backplane of claim 9 wherein at least one of said panels and said spacer have aligned openings therethrough to expose an inside surface portion on the other of said panels that defines one of said inside surface connector areas.

11. The backplane of claim 9 wherein each said panel has a panel periphery, at least certain of said inside surface connector areas on each of said panels being adjacent said panel outer periphery.

12. A power distribution backplane comprising: a pair of metal panels bonded to opposite sides of a dielectric spacer; each said panel having an inside surface facing toward said spacer and an opposite outer surface; each said panel having opposite sides; splice plate connector areas adjacent said opposite sides of each of said panels; and a plurality of connectors within each said splice plate connector area for connecting splice plates thereto to interconnect adjacent backplanes.

13. The backplane of claim 12 wherein said metal panels are coated with an electrical insulating coating and said splice plate connector areas are free of said coating to expose a base metal surface.

14. The backplane of claim 13 wherein said splice plate connector areas are on said inner surface of one of said panels and on said outer surface of the other of said panels.

15. The backplane of claim 14 wherein said splice plate connector areas on said inner surface of said one panel project outwardly beyond said spacer.

16. The backplane of claim 12 wherein said backplane has opposite ends and said splice plate connector areas on one of said panels are adjacent one of said opposite ends while said splice connector areas on the other of said panels are adjacent the other of said opposite ends.

17. The backplane of claim 16 where in said splice plate connector areas on one of said panels are on said inside surface thereof and said splice plate connector areas on the other of said panels are on said outer surface thereof.

18. The backplane of claim wherein said one panel has a negative polarity and said other panel has a positive polarity.

19. A power distribution backplane comprising:
a pair of metal panels bonded to opposite sides of a dielectric spacer;
each said panel having an inside surface facing toward said dielectric spacer and an opposite outer surface;
each of said outer surfaces having a plurality of outer surface connections thereon;
each of said inner surfaces having inner surface connector areas that are uncovered by said dielectric spacer;
said inner surface connector areas having a plurality of connectors thereon; and
each of said panels having a flange thereon for connecting a busbar thereto.

20. A power distribution backplane comprising:
a pair of metal panels bonded to opposite sides of a dielectric spacer;
each said panel having an inside surface facing toward said dielectric spacer and an opposite outer surface;
each of said outer surfaces having a plurality of outer surface connections thereon;
each of said inner surfaces having inner surface connector areas that are uncovered by said dielectric spacer;
said inner surface connector areas having a plurality of connectors thereon; and
one of said panels having an offset end portion that is offset in a direction away from the other of said panels.

21. The backplane of claim 20 wherein said one of said panels has a flange extending from the opposite end portion thereof in the same direction as said offset end portion.

22. The backplane of claim 20 wherein said offset end portion has a plurality of connectors thereon.

23. A power distribution backplane comprising:
a pair of metal panels bonded to opposite sides of a dielectric spacer;
each said panel having an inside surface facing toward said dielectric spacer and an opposite outer surface;
each of said outer surfaces having a plurality of outer surface connections thereon;
each of said inner surfaces having inner surface connector areas that are uncovered by said dielectric spacer;
said inner surface connector areas having a plurality of connectors thereon; and
at least one ground return connector attached to one of said panels and extending outwardly therefrom perpendicular thereto.

24. A power distribution backplane comprising:
a pair of metal panels bonded to opposite sides of a dielectric spacer;

each said panel having an inside surface facing toward said dielectric spacer and an opposite outer surface;

each of said outer surfaces having a plurality of outer surface connections thereon;

each of said inner surfaces having inner surface connector areas that are uncovered by said dielectric spacer;

said inner surface connector areas having a plurality of connectors thereon;

each of said metal panels having opposite sides; and splice plate connector areas adjacent said opposite sides of each said metal panel for interconnecting two or more backplanes.

25. The backplane of claim 24 wherein said splice plate connector areas on one of said metal panels are on said inside surface thereof and said splice plate connector areas on the other of said metal panels are on said outer surface thereof.

26. The backplane of claim wherein said one metal panel has a negative polarity and said other metal panel has a positive polarity.

27. A power distribution backplane comprising: a pair of metal panels bonded to opposite sides of a dielectric spacer; each said panel having an inside surface facing toward said spacer and an opposite outer surface; each of said outer surfaces having a plurality of outer surface connectors thereon; each of said inside surfaces on each of said panels having inside surface connector areas that are exposed past said spacer and the other of said panels; a plurality of connections on said inside surfaces of said inside surface connector areas; and busbar connector flanges on each of said panels.

28. A power distribution backplane comprising: a pair of metal panels bonded to opposite sides oh dielectric spacer; each said panel having an inside surface facing toward said spacer and an opposite outer surface; each of said outer surfaces having a plurality of outer surface connectors thereon; each of said inside surfaces on each of said panels having inside surface connector areas that are exposed past said spacer and the other of said panels; a plurality of connectors on said inside surfaces of said inside surface connector areas; and at least one of said panels having an offset end portion that is offset in a direction away from the other of said panels.

* * * * *

UNITED STATES PATENT AND TRADEMARK OFFICE
CERTIFICATE OF CORRECTION

PATENT NO. : 6,759,598 B2  Page 1 of 1
DATED : July 6, 2004
INVENTOR(S) : Kolody et al.

It is certified that error appears in the above-identified patent and that said Letters Patent is hereby corrected as shown below:

<u>Column 7,</u>
Line 6, change "therein" to -- wherein --.

<u>Column 9,</u>
Line 19, after "claim" insert -- 25 --.

Signed and Sealed this

Seventh Day of December, 2004

JON W. DUDAS
*Director of the United States Patent and Trademark Office*